US006634768B2

(12) United States Patent
McKenzie et al.

(10) Patent No.: US 6,634,768 B2
(45) Date of Patent: Oct. 21, 2003

(54) EMERGENCY NOTIFICATION SYSTEM

(76) Inventors: Roy L. McKenzie, 3960 Brookside Pkwy., Decatur, GA (US) 30034; Anthony Haynes, 1140 Maple Walk, Decatur, GA (US) 30032

( * ) Notice: Subject to any disclaimer, the term of this patent is extended or adjusted under 35 U.S.C. 154(b) by 133 days.

(21) Appl. No.: 09/867,226

(22) Filed: May 29, 2001

(65) Prior Publication Data

US 2001/0038339 A1 Nov. 8, 2001

Related U.S. Application Data

(63) Continuation-in-part of application No. 09/335,270, filed on Jun. 17, 1999, now Pat. No. 6,238,061.

(51) Int. Cl.[7] ........................ F21V 33/00; H05K 11/00; H04Q 7/00

(52) U.S. Cl. ...................... 362/253; 362/276; 362/802; 340/539; 455/344

(58) Field of Search ................................ 340/326, 539, 340/693.2, 825.36; 348/734; 362/86–88, 253, 276, 802; 455/344, 347, 346; 439/188

(56) References Cited

U.S. PATENT DOCUMENTS

| | | | | |
|---|---|---|---|---|
| 3,368,067 A | | 2/1968 | Paxinos | 362/253 |
| 3,898,383 A | | 8/1975 | Herbits | 362/253 |
| 4,079,413 A | | 3/1978 | Yamashita | 358/83 |
| 4,223,301 A | * | 9/1980 | Grimes et al. | 340/500 |
| 4,285,028 A | | 8/1981 | Sundin et al. | 362/35 |
| 4,394,691 A | * | 7/1983 | Amano et al. | 348/734 |
| 4,676,619 A | | 6/1987 | Woolley | 396/432 |
| 4,730,184 A | * | 3/1988 | Bach | 340/539 |
| 5,055,986 A | | 10/1991 | Johnson | 362/253 |
| 5,163,747 A | | 11/1992 | Cheng | 362/86 |
| 5,309,145 A | | 5/1994 | Branch et al. | 340/540 |
| 5,410,326 A | * | 4/1995 | Goldstein | 348/734 |
| 5,465,198 A | | 11/1995 | Kellogg | 362/253 |
| 5,488,427 A | | 1/1996 | Kayashima et al. | 348/569 |
| 5,517,345 A | * | 5/1996 | Joaille | 455/346 |
| 5,541,820 A | | 7/1996 | McLaughlin | 362/253 |
| 5,587,704 A | * | 12/1996 | Foster | 340/539 |
| 5,623,245 A | * | 4/1997 | Gilmore | 340/426 |

FOREIGN PATENT DOCUMENTS

JP 402109282 A * 4/1990 ................ 439/188

* cited by examiner

*Primary Examiner*—Alan Cariaso
(74) *Attorney, Agent, or Firm*—Thomas, Kayden, Horstemeyer & Risley

(57) ABSTRACT

The emergency notification system includes a housing (11) that supports a lamp (15), a television (18), a radio (25), and a plug receptacle (29) for powering auxiliary appliances. Remote control sensors (17, 20, 24 and 30) actuate switches for energizing the elements of the invention, in response to remote control transmitters, such as hand-held transmitter (30) or a community transmitter actuated by emergency communication personnel.

18 Claims, 3 Drawing Sheets

EMERGENCY NOTIFICATION SYSTEM

CROSS REFERENCE

This is a continuation-in-part of U.S. patent application Ser. No. 09/335,270, filed in the U.S. Patent and Trademark Office on Jun. 17, 1999, now U.S. Pat. No. 6,238,061.

FIELD OF THE INVENTION

This invention relates to a communication system for alerting a person of an impending or occurring disaster or other emergency.

BACKGROUND OF THE INVENTION

When a disaster or other emergency threatens a community, it is important for the officials of the community to alert the people in the area about the impending or occurring emergency and to instruct them of the nature of the event as well as with instructions as to how to avoid personal injury and damage to personal property.

For example, in the event of an impending severe storm or forest fire that is expected to sweep through a community, the local radio and television stations typically broadcast a forecast so as to alert its listeners. While this system is likely to be successful for the majority of the inhabitants of a community, there are others that remain unreachable and must rely upon some other form of communication, such as person-to-person communication, to be alerted to the situation.

The communication of an emergency to the unsuspecting public is particularly difficult in an after-hours situation in which most inhabitants are asleep. The radio and television communication facilities in the typical household usually are cut off and, therefore, not available for communication to the inhabitants of the household. In some instances, the inhabitants of a household are handicapped by poor vision or poor hearing and are not likely to be alerted by conventional communication facilities at any time of a 24-hour day.

Accordingly, there is a need for an effective way for responsible news agencies such as radio and television stations, weather authorities and government officials to disseminate information and instructions to the public in times of local or national emergency, or in the event of a disaster. While the ability to broadcast instantly from radio and television facilities has been available for many years, a problem arises when attempting to reach those that are not tuned in to the communication facilities. Accordingly, there is a need to draw the attention of the inattentive or partially handicapped person to the emergency broadcast.

Another situation is when a power failure or "black out" strikes a community. During an emergency or disaster situation, it is important that the usual emergency communications be maintained to the inhabitants of the community, even though the typical radio or television set is disabled. This is important not only for the physical safety but for the emotional response of the inhabitants to the emergency situation. In the event of a disaster such as an earthquake, tornado, hurricane, flood or fire in a community, it is desirable that the inhabitants be informed as early as possible that the disaster is imminent, informing the public of the safety procedures that might be taken at the household to protect the inhabitants and the property within the household, and to inform the inhabitants of the community of evacuation routes and procedures.

In addition to notification of impending and existing emergencies by radio, video images can provide visual details of the emergency condition, evacuation routes, oncoming adverse conditions and safety procedures. Visual display can serve citizens who are hearing impaired, enabling them to see exactly what the conditions are and what precautions and actions are best advised by the civil authorities.

Thus, there is a need for providing an alert system to establish communications from the television and radio broadcast services to the unknowing public in the event of an impending or occurring natural disaster or other emergency situation. By alerting the unknowing person to direct his or her attention to the radio/television broadcast, the information from the broadcast system can provide the emergency procedures, the information for avoidance and safety and evacuation from the vicinity.

SUMMARY OF THE INVENTION

Briefly described, the present invention comprises an improved alert system for establishing communications between a public or other broadcast facility and individuals in the event of hazardous, dangerous or other emergency situations that are impending or occurring. The invention includes, in various combinations, a lamp, a radio, a clock, a television, jacks for auxiliary speakers and other jack-connected auxiliary items, and a plug receptacle for supplying power to other auxiliary attachments desired by the owner of the system. Such auxiliary attachments can include a flashing light apparatus, a vibrator, a siren, a video monitor, and actuators for operating doors, windows, shutters and other safety structures about a building. In addition, the system can include a timer for de-actuating the system after a predetermined period, to avoid depletion of energy from batteries and to terminate the active condition when the owner is not present and avoid disturbance of others over a prolonged period.

DETAILED DESCRIPTION OF THE PREFERRED EMBODIMENTS

Figure 1:
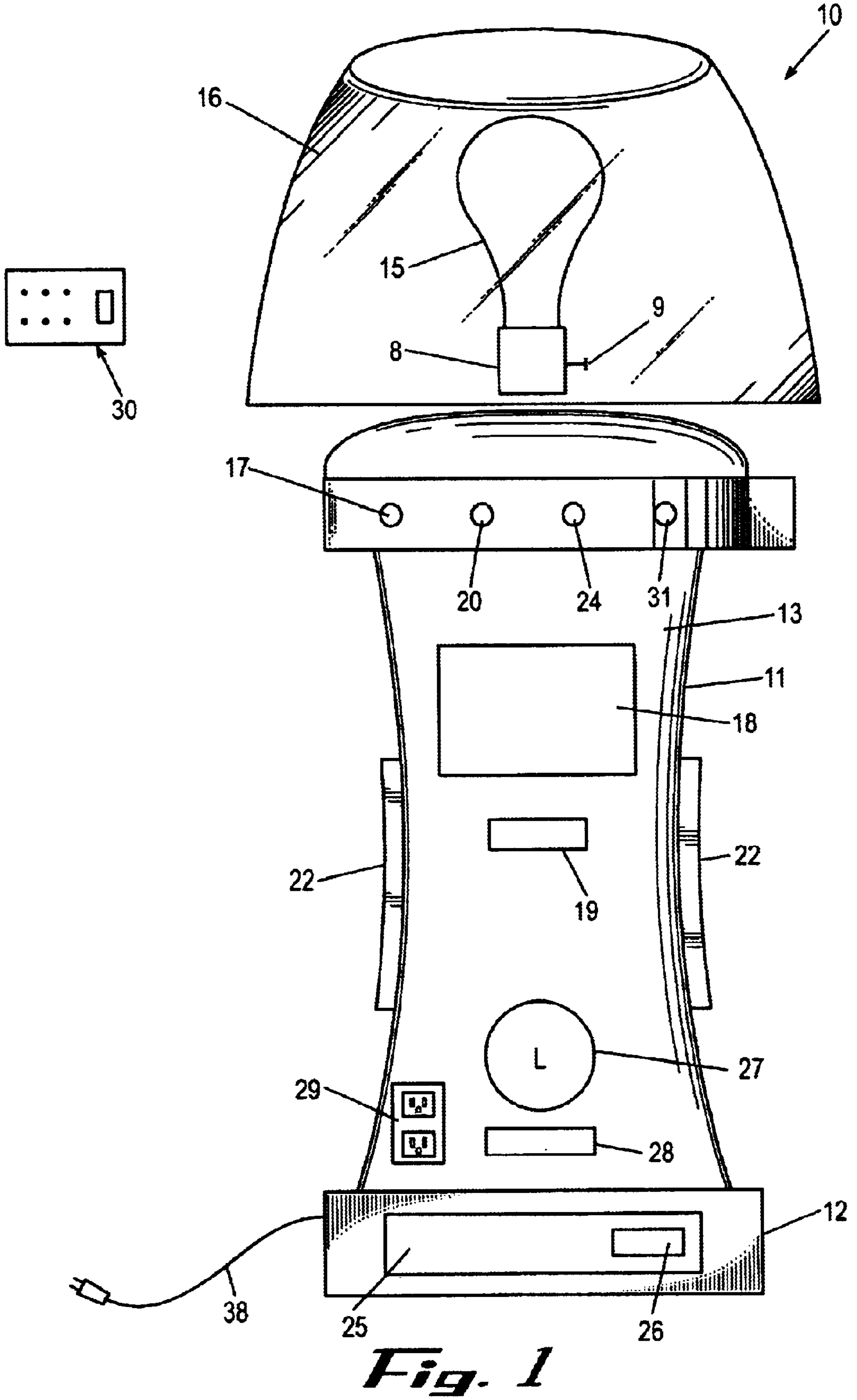
FIG. 1 is a side elevational view of the Emergency notification system, showing the housing and the lamp shade and lamp mounted to the housing.

Referring now in more detail to the drawings, in which like numerals indicated like parts throughout the several views, FIG. 1 illustrates a preferred embodiment of the emergency notification system 10 which, in this embodiment, comprises a housing 11 for resting on a flat surface such as a table top. The housing includes several main sections representing a combined lamp, alarm clock, radio receiver, television receiver, with common speakers, and a utility outlet for other electrical appliances, all integrally contained within the housing 11.

The housing includes a base 12 with the lamp section 13 of the housing resting on the base. The lamp section 13 comprises a source of illumination 15, a conventional light bulb, a socket 8 for receiving the light bulb 15, with the socket including a rotary switch 9 of conventional design. A shade 16 is mounted on the light bulb 15, with the shade covering the illumination source so as to provide a pleasant lighting effect. Optionally, a dimmer control 7 is associated with socket 8 so as to control the intensity of light emitted from the light bulb 15. A remote control signal sensor 17 is provided on the housing 11 for energizing and de-energizing the lamp.

The source of illumination 15 and the shade 16 provide illumination in a 360° arc so as to illuminate the entire space. However, an opaque shade can be used, if desired, to provide less than a 360° arc. The remote control signal sensor 17 detects remote control signals that instruct the lamp section to energize or de-energize the source of illumination 15. Likewise, the dimmer control 7 can be remotely energized through the same remote control signal sensor 17, so as to adjust the intensity of the lamp from a remote position.

The television receiver section includes television signal receiving circuitry (FIG. 2), a television screen 18 for viewing the television pictures received, a control panel 19, and a remote control signal sensor 20. The sensor 20 detects remote control signals that instruct the television receiver section to energize or de-energize the television receiver circuitry so as to control the image produced on the television screen 18, as well as to increase or decrease the volume of sound associated with the television signal received.

The radio receiver section is mounted in the base 12 and includes a control panel 25 that includes a tuning indicator or display 26 and a remote control signal sensor 24. The sensor 24 detects remote control signals that instruct the radio signal receiver to energize or de-energize the radio receiver circuitry, as well as to increase or decrease the volume of sound produced thereby.

A clock 27, having a settable alarm capability, is provided with its own control panel 28. The clock control panel is used to both set the alarm time and to set the clock.

Loud speakers 22 are provided to reproduce audible sound from the television receiver section, from the radio receiver section, and from the alarm clock 27.

Figure 3:
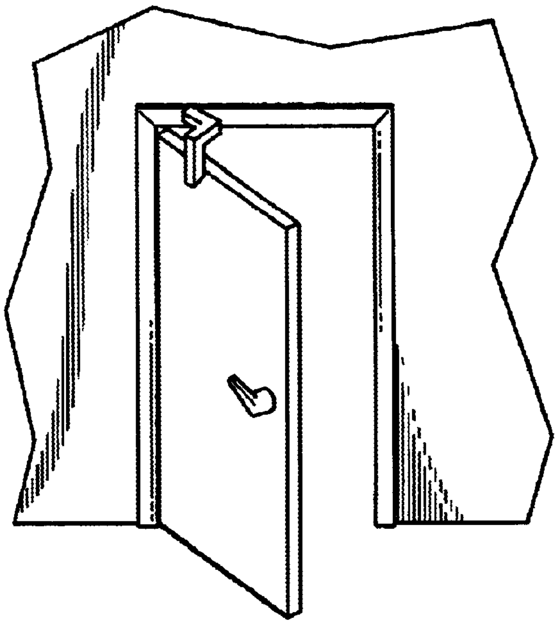
FIG. 3 is an elevational view of a door and its door closer that is operated by the system.
Figure 4:
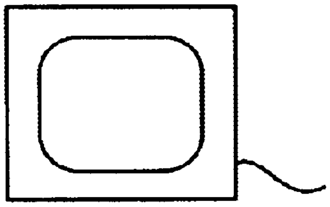
FIGS. 4–10 are a television set, a radio, a vibrator, a flashing light, a siren, a CD player and a timer, respectively.
Figure 5:
Figure 6:
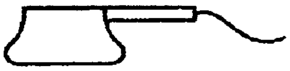
Figure 7:
Figure 8:
Figure 9:
Figure 10:

An electrical plug receptacle 29 is mounted in the housing 11 for electrical connection to other auxiliary equipment, which may include a television set, a radio, a flashing light attachment, a siren attachment, a CD player, a video tape player, and various actuators that can be connected to doors, shutters, windows, or other safety structures about a building. For example, FIG. 3 shows a door closer 34 that can be plugged into the electrical receptacle 29 and arranged to respond to the emergency notification system to close the door in the event of an emergency, particularly in the event of a fire. Also, FIG. 4 shows a television set, FIG. 5 shows a radio, FIG. 6 shows a vibrator, FIG. 7 shows a light attachment that can be a flashing light, FIG. 8 shows a siren attachment, FIG. 9 shows a CD player, and FIG. 10 shows a timer.

One or more battery powered, hand-held remote control devices 30 are provided so that the user can control the functions and features of the various sections of the emergency notification system. The remote control signal sensor 17, 20, 24 and 31 all can be energized by one or more hand-held transmitters. Likewise, one or all of the remote control signal sensors 17, 20, 24 and 31 can be energized by a transmitter form a more remote location, such as from a centrally located community emergency transmitter, similar to that of a weather station. The remote control signal emitter device issues an electronic signal such as an infrared signal, radio frequency, or signal of other conventional electronic frequency, detectable by the respective various remote control sensors 17, 20, 24 and 31 in order to control the source of illumination or light bulb 15, the television 19, radio 25 and the plug receptacle 29.

In the alternative, if the user so chooses, each section of the emergency notification system can be manually controlled by switches at their respective control panels. For example, lamp 15 can be manually turned off and on by its switch 9, and dimmed by the dimmer control 7. The television receiver can be manually controlled by its switch 37 at control panel 19, the radio receiver section can be manually controlled by its switch 39 at its control panel 25, and the electrical plug receptacle 29 can be manually controlled by its switch 41.

In order to limit the amount of time that the system can operate, a timer switch 44 is placed in the circuit between the power supply and the operative elements of the system. The timer switch limits the time in which the system operates. This avoids the system operating for a long time in the situation when there is no one present in the vicinity of the system, thereby avoiding depletion of the power available to operate the system and avoiding annoying others.

Under normal conditions, the emergency notification system 10 is energized by a source of alternating current (AC) power, such as ordinary household current. The AC power is supplied to the housing 11 via a power supply cord 38, when the power supply cord 3 8 is connected to an AC source in the usual manner.

Figure 2:
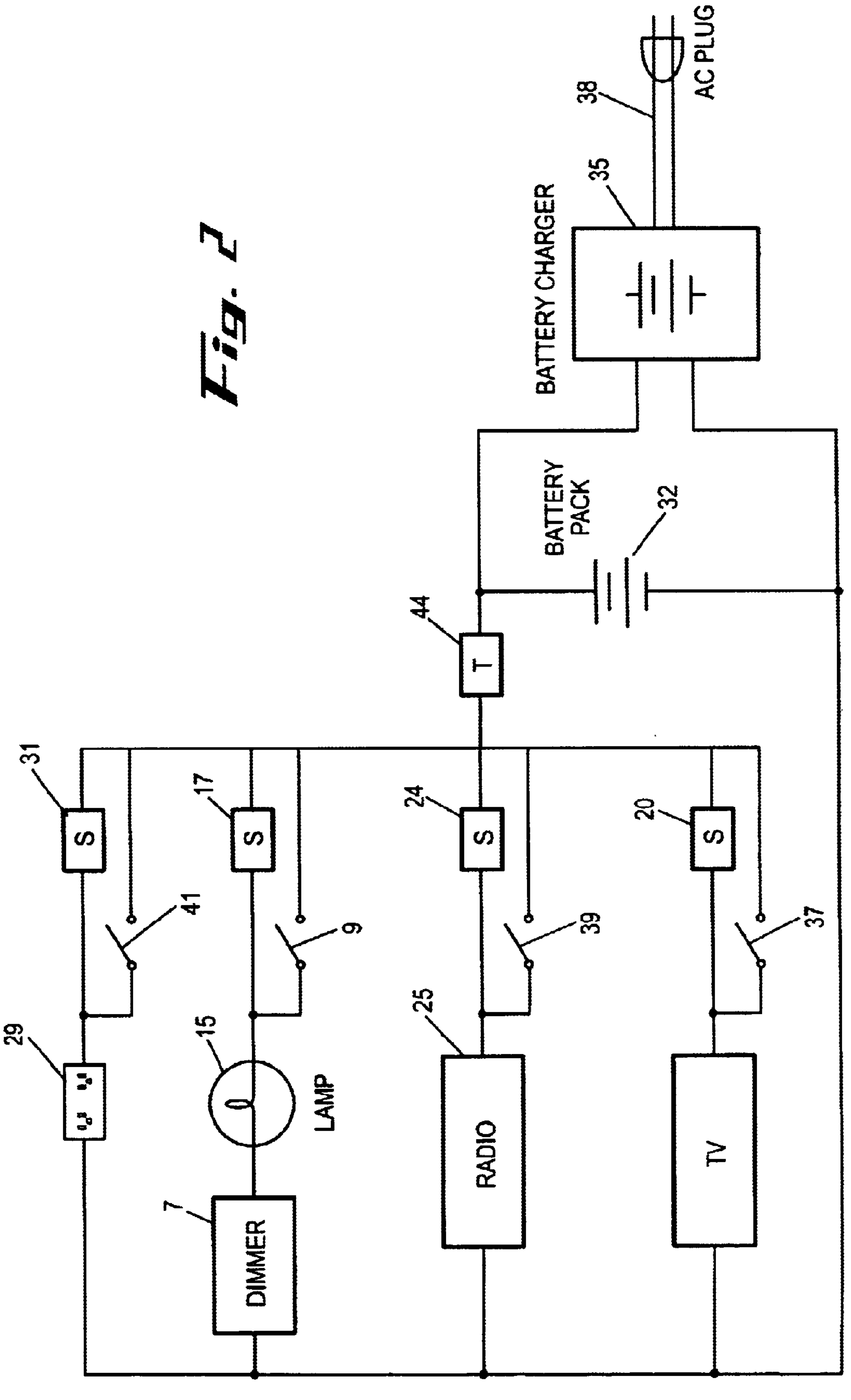
FIG. 2 is a schematic wiring diagram of the Emergency notification system.

However, as shown in FIG. 2, the power supply cord 38 can be connected to a battery charger 35, and the battery charger connected to battery pack 32. The battery pack is then used as a DC power source for the emergency notification system.

Upon the occurrence of an emergency situation, such as a power failure or blackout, the apparatus of the present invention is energized by the direct current (DC) source, such as battery pack 32. The battery pack and the battery charger are contained within housing 11 in a battery compartment. The battery pack 32 may comprise one or more batteries. The batteries in the battery pack may be either disposable or rechargeable. In the instance of the batteries being rechargeable, recharging power is obtained from converted AC current via battery charging circuitry when the apparatus 10 is connected to a source of AC power by the AC power cord 38. In other words, the battery pack is constantly recharged when the emergency notification system 10 is provided with AC power so that in the event of an emergency situation, the battery pack is fully charged and is capable of powering the illumination source 15, the radio 25, the television 18, the clock 27, and the utility plug for auxiliary appliances.

FIG. 2 shows a schematic wiring diagram for the emergency survival apparatus of the present invention. The source of illumination or light bulb 15 is in electrical connection with and energized by the source of power, either AC power supplied through the power supply cord 38, or DC power supplied from the battery pack 32. The case as to which source 38 or 32 is actually supplying the power to the illumination source 15 depends upon whether or not an emergency situation exists requiring the use of the battery pack 32. Similarly, the radio receiver section, the television receiver section, and the plug for auxiliary appliances are all in electrical connection with the AC source and the DC source.

Another embodiment of the present invention comprises the lamp alone. As shown and discussed with respect to FIGS. 1 and 2, electrical power is provided by either a source of alternating current (AC) or by a source of direct current (DC), including the battery recharging features. A hand-held remote control, such as remote control 30, serves to control the lamp, that is to turn it on and off and to control its brightness.

Yet another embodiment of the present invention comprises only the lamp and the radio receiver, in which case both are controllable by a hand-held remote control 30, and the combination can be supplied by either AC power or DC power, as discussed with respect to FIG. 1, wherein the battery pack 32 is supplied with recharging power by the battery charger 35.

Still another embodiment of the present invention comprises the lamp section and the radio receiver section, or the lamp section and the television receiver section. In either case, however, electrical power is provided by either a source of alternating current (AC) or by a source of direct current (DC), wherein the battery pack 32 is supplied with recharging power by the battery charger 35.

Although preferred embodiments of the invention have been disclosed in detail herein, it will be obvious to those skilled in the art that variations and modifications of the disclosed embodiments can be made without departing from the spirit and scope of the invention as set forth in the following claims.

What is claimed is:

1. An emergency survival apparatus comprising:

an illumination means for casting light, said illumination means coupled to a first remote control sensor via a first switch, said first switch configured to actuate said illumination means in response to a first signal transmitted from said first remote control sensor;

a television receiver, said television receiver coupled to a second remote control sensor via a second switch, said second switch configured to actuate said television receiver in response to a second signal transmitted from said second remote control sensor;

a radio receiver, said radio receiver coupled to a third remote control sensor via a third switch, said third switch configured to actuate said radio receiver in response to a third signal transmitted from said third remote control sensor; and a housing, said housing configured for mounting said illumination means, said television receiver and said radio receiver as an integral unit.

2. The emergency survival apparatus of claim 1, and further including a timepiece mounted to said housing, and wherein said illumination means, said timepiece, and said television receiver are all powered by a source of direct current.

3. The emergency survival apparatus of claim 1, and further including a timepiece mounted to said housing, and wherein said illumination means, said timepiece, said television receiver and said radio receiver are all powered by a source of alternating current.

4. The emergency survival apparatus of claim 1, wherein said illumination means includes a dimmer control.

5. The emergency survival apparatus of claim 1, wherein said first remote control sensor is responsive to a first control signal of a first predetermined frequency.

6. The emergency survival apparatus of claim 5, wherein said second remote control sensor is responsive to a second control signal of a second predetermined frequency, said second predetermined frequency different from the frequency of said first control signal.

7. An emergency survival apparatus for dissemination of emergency information comprising:

a housing;

a power source, said power source coupled to a plug receptacle via a switch, said switch configured to receive a control signal and permit power to said plug receptacle based upon said control signal supported by said housing;

a remote controlled sensor mounted to said housing for configured to sense a radio signal of a predetermined frequency, said remote controlled sensor further configured to transmit said control signal to said switch in response to said radio signal;

a personnel alerting device for communicating information to a person, said personnel alerting device is one selected from the group consisting of: a first television set, a first radio, a first lamp, a flashing lamp, a vibrator, a first noise emitting siren, a compact disc player, a first timer, and an actuator for operating a door, said personnel alerting device electrically connected to said plug receptacle; and television set supported on said housing.

8. An emergency survival apparatus for dissemination of emergency information comprising:

a housing;

a power source supported by said housing;

a plug receptacle supported by said housing for connection to an auxiliary device remote from said housing;

a remote controlled sensor mounted to said housing for sensing a radio signal of a predetermined frequency;

a power switch coupled to said power source and said plug receptacle, said power switch configured to provide power to said plug receptacle in response to a control signal from said remote controlled sensor; and a personnel alerting device for communicating information to a person, said personnel alerting device is one selected from the group consisting of: a television set, a radio, a lamp, a flashing lamp, a vibrator, a noise emitting siren, a compact disc player, a timer, and an actuator for operating a door, said personnel alerting device electrically connected to said plug receptacle, wherein said television set and said radio are set to a frequency for receiving emergency broadcasts.

9. The emergency survival system of claim 7, wherein said power source is a battery.

10. The emergency survival system of claim 7, wherein said power source is alternating current.

11. The emergency survival system of claim 7 and further including a second lamp supported on said housing.

12. The emergency survival system of claim 7, and further including a second radio supported by said housing.

13. The emergency survival system of claim 7, and further including a second radio and a second lamp supported on said housing.

14. The emergency survival system of claim 7, and further including a second timer supported on said housing, and a timer switch coupled to said second timer, said timer switch configured to receive a disconnect signal from said second timer and configured to disconnect said power source based upon said disconnect signal.

15. An alert system for dissemination of emergency information from a public broadcast facility, comprising:

a housing;

a power source carried by said housing;

an electrical plug receptacle supported by said housing;

a remote controlled sensor supported by said housing responsive to an electronic signal emitted from an emergency broadcast system;

a power switch coupled to said power source and said electrical plug receptacle, said power switch configured to provide power to said electrical plug receptacle in response to a control signal from said remote controlled sensor; and a human alert apparatus plugged into said electrical plug receptacle for alerting people to emergency information.

16. The alert system of claim 15, wherein said power source is a battery.

17. The alert system of claim 15, wherein said power source is a circuit for transmitting alternating current.

18. The alert system of claim 15, and wherein said human alert apparatus plugged into said electrical plug receptacle is one selected form the group consisting of: a television set, a radio, a siren, a vibrator, a flashing light apparatus, a door closed, and a television monitor.

* * * * *